(12) United States Patent
Yoshimura et al.

(10) Patent No.: US 11,901,946 B2
(45) Date of Patent: Feb. 13, 2024

(54) OPTICAL TRANSMITTER

(71) Applicants: Sumitomo Electric Industries, Ltd., Osaka (JP); Sumitomo Electric Device Innovations, Inc., Yokohama (JP)

(72) Inventors: Satoshi Yoshimura, Osaka (JP); Hiroshi Hara, Osaka (JP); Eiji Tsumura, Osaka (JP); Masanobu Kawamura, Yokohama (JP)

(73) Assignees: Sumitomo Electric Industries, Ltd., Osaka (JP); Sumitomo Electric Device Innovations, Inc., Kanagawa (JP)

( * ) Notice: Subject to any disclaimer, the term of this patent is extended or adjusted under 35 U.S.C. 154(b) by 71 days.

(21) Appl. No.: 17/779,673

(22) PCT Filed: Jun. 11, 2021

(86) PCT No.: PCT/JP2021/022324
§ 371 (c)(1),
(2) Date: May 25, 2022

(87) PCT Pub. No.: WO2021/251486
PCT Pub. Date: Dec. 16, 2021

(65) Prior Publication Data
US 2022/0416901 A1 Dec. 29, 2022

(30) Foreign Application Priority Data
Jun. 12, 2020 (JP) .................... 2020-102408

(51) Int. Cl.
*H04B 10/50* (2013.01)
*H04B 10/564* (2013.01)
(Continued)

(52) U.S. Cl.
CPC ......... *H04B 10/501* (2013.01); *G02B 6/4286* (2013.01); *G02B 7/008* (2013.01); *H04B 10/564* (2013.01)

(58) Field of Classification Search
CPC .. H04B 10/501; H04B 10/564; G02B 6/4286; G02B 7/008
(Continued)

(56) References Cited

U.S. PATENT DOCUMENTS 6,155,724 A * 12/2000 Ichino .................. G02B 6/4244
385/94
6,498,666 B1* 12/2002 Asghari ............... G02B 6/4246
398/139
(Continued)

FOREIGN PATENT DOCUMENTS

JP 07-113931 A 5/1995
JP 07113931 A * 5/1995
(Continued)

*Primary Examiner* — Li Liu
(74) *Attorney, Agent, or Firm* — Volpe Koenig

(57) ABSTRACT

An optical transmitter according to one embodiment includes a housing with an emission end, a light emitting element mounted on a first mounting portion of the housing, and a light receiving element mounted on a second mounting portion of the housing to monitor output light from the light emitting element. The second mounting portion is provided with a carrier, a first resin located on an emission end side of a lower side of the carrier, and a second resin located on a light emitting element side of the lower side of the carrier. A coefficient of thermal expansion of the first resin is smaller than a coefficient of thermal expansion of the second resin.

7 Claims, 14 Drawing Sheets

(51) Int. Cl.
*G02B 6/42* (2006.01)
*G02B 7/00* (2021.01)

(58) Field of Classification Search
USPC .......................................... 398/136, 192, 201
See application file for complete search history.

(56) References Cited

U.S. PATENT DOCUMENTS

| | | | |
|---|---|---|---|
| 2001/0017964 A1* | 8/2001 | Setoguchi ............ | G02B 6/4253 |
| | | | 385/88 |
| 2003/0108077 A1 | 6/2003 | Fujita | |
| 2004/0264523 A1 | 12/2004 | Posamentier | |
| 2016/0028489 A1* | 1/2016 | Saeki .................. | G02B 6/4214 |
| | | | 398/79 |
| 2021/0006036 A1 | 1/2021 | Shirasaki et al. | |

FOREIGN PATENT DOCUMENTS

| | | | |
|---|---|---|---|
| JP | 2003-174227 A | | 6/2003 |
| JP | 2009-260095 A | | 11/2009 |
| JP | 2013-182954 A | | 9/2013 |
| JP | 2013182954 A | * | 9/2013 |
| WO | 2019/202632 A1 | | 10/2019 |

* cited by examiner

OPTICAL TRANSMITTER

TECHNICAL FIELD

The present disclosure relates to optical transmitters,

This application claims priority based on Japanese Application No. 2020-102408 filed on Jun. 12, 2020, which incorporates the entire contents described in the Japanese application.

BACKGROUND ART

Patent Literature 1 describes a semiconductor module. The semiconductor module includes a semiconductor laser, a condensing lens that condenses light from the semiconductor laser, a photodiode that monitors the light from the semiconductor laser, a metal case that accommodates the semiconductor laser, the condensing lens, and the photodiode, and a metal lid. The metal case and the metal lid are provided with an emission end having an optical fiber that emits the light condensed by the condensing lens to an outside. The photodiode that monitors the light from the semiconductor laser is provided on an opposite side of the emission end as viewed from the semiconductor laser.

CITATION LIST

Patent Literature

Patent Literature 1: Japanese Unexamined Patent Publication No. H7-113931

SUMMARY OF INVENTION

An optical transmitter according to one aspect includes a housing with an emission end, a light emitting element mounted on a first mounting portion of the housing, and a light receiving element mounted on a second mounting portion of the housing to monitor output light from the light emitting element. The second mounting portion is provided with a carrier, a first resin located on an emission end side of a lower side of the carrier, and a second resin located on a light emitting element side of the lower side of the carrier. A coefficient of thermal expansion of the first resin is smaller than a coefficient of thermal expansion of the second resin.

An optical transmitter according to another aspect includes a housing with an emission end, a light emitting element mounted on a first mounting portion of the housing, and a light receiving element mounted on a second mounting portion of the housing to monitor output light from the light emitting element. The second mounting portion is provided with a carrier and a first resin located on a lower side of the carrier, and a coefficient of thermal expansion of the first resin is larger than a coefficient of thermal expansion of the carrier.

DESCRIPTION OF EMBODIMENTS

Figure 1:
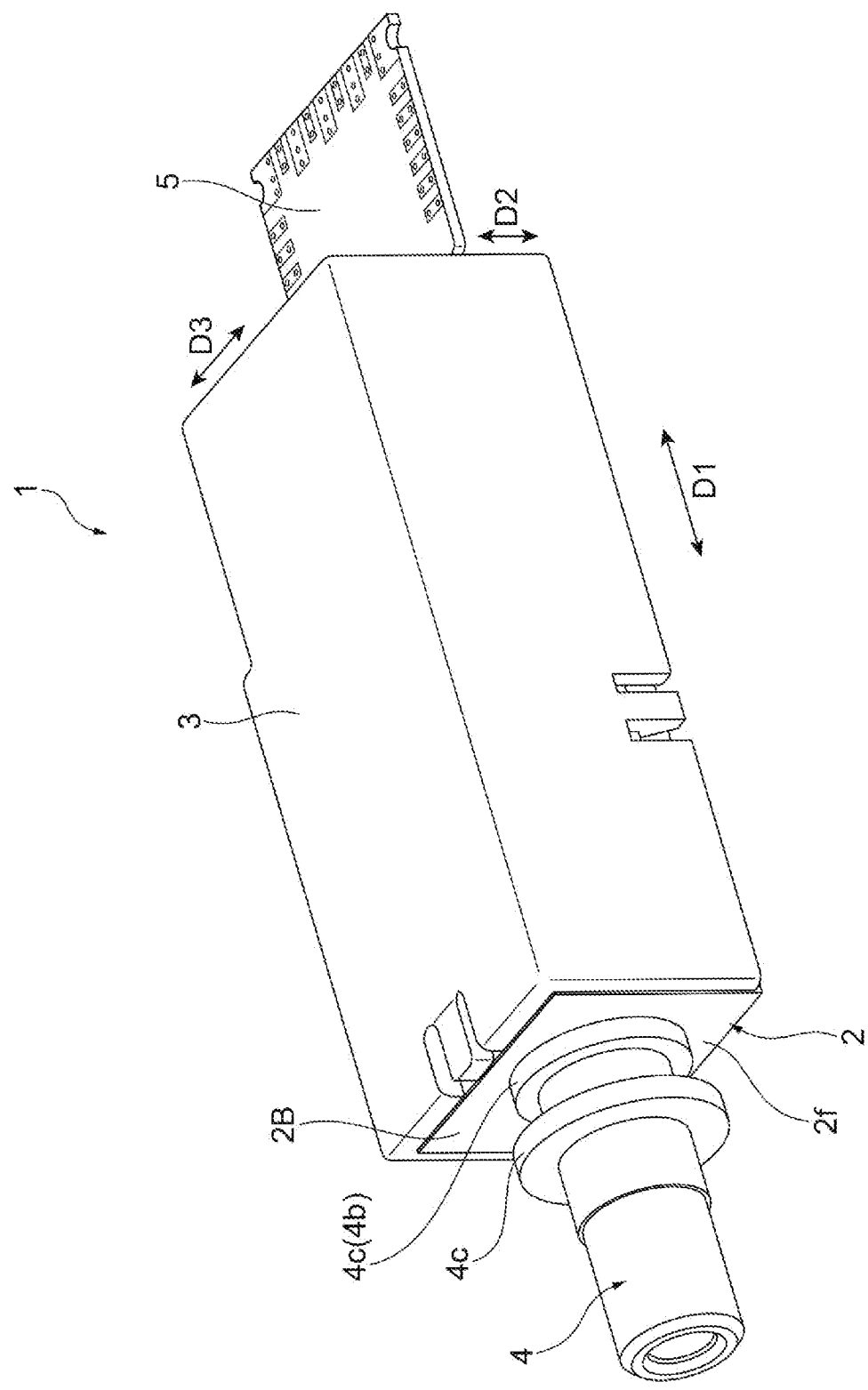
FIG. 1 is a perspective view illustrating an optical transmitter according to an embodiment.

In some cases, in order to secure a large internal space, a photodiode may be disposed on an emission end side as viewed from a semiconductor laser. In this case, when a light receiving surface of the photodiode is disposed parallel to an optical axis of output light from the semiconductor laser, light receiving sensitivity of the photodiode is decreased. For this reason, the photodiode may be disposed so that the light receiving surface is inclined with respect to the optical axis of the output light from the semiconductor laser. In this case, the photodiode is disposed on an inclined protrusion provided in the housing.

However, the housing may cause warping or the like under a high temperature environment. When the warping or the like occurs, the output of light from the housing to the outside may be decreased even though the received light amount of the photodiode is not changed. Under a high temperature environment, the optical axis of the output light from the semiconductor laser may deviate from the center of the optical fiber, and as a result, the light amount of the output light to the optical fiber may be decreased at a high temperature.

An object of the present disclosure is to provide an optical transmitter capable of suppressing the decrease in the light amount of the output light that occurs at a high temperatures.

According to the present disclosure, it is possible to suppress the decrease in the light amount of the output light that occurs at a high temperatures.

The details of the embodiments of the present disclosure will be listed and described. An optical transmitter according to one embodiment includes a housing with an emission end, a light emitting element mounted on a first mounting portion of the housing, and a light receiving element mounted on a second mounting portion of the housing to monitor output light from the light emitting element. The second mounting portion is provided with a carrier, a first resin located on an emission end side of a lower side of the carrier, and a second resin located on a light emitting element side of the lower side of the carrier. A coefficient of thermal expansion of the first resin is smaller than a coefficient of thermal expansion of the second resin.

In the optical transmitter, the light emitting element is mounted on the first mounting portion of the housing, and the light receiving element that monitors the output light from the light emitting element is mounted on the second mounting portion of the housing. The second mounting portion has a carrier that mounts the light receiving element, a first resin that is located on the lower side and the housing emission end side of the carrier, and a second resin that is located on the lower side and the housing light emitting element side of the carrier. The coefficient of thermal expansion of the first resin located on the emission end side is smaller than the coefficient of thermal expansion of the second resin located on the light emitting element side. Therefore, under a high temperature environment, since the first resin located on the emission end side expands thermally smaller than the second resin located on the light emitting element side, the received light amount of the light receiving element can be intentionally reduced. As a result, even when the warping or the like occurs in the housing under a high temperature environment and the light output to the outside of the housing is likely to be decreased, the received light amount of the light receiving element is reduced, so that the power of light from the light emitting element can be increased. Therefore, even when the warping or the like occurs in the housing at a high temperature, since the influence of the warping can be reduced by the first resin and the second resin, the decrease in the light amount of the output light to the optical fiber can be suppressed at a high temperature.

A mounting surface of the light receiving element of the second mounting portion may be disposed so as to be inclined with respect to an optical axis of the output light from the light emitting element. In this case, under a high temperature environment, since the first resin located on the emission end side expands thermally smaller than the second resin located on the light emitting element side, a configuration in which the inclination angle becomes smaller can be effectively realized.

A height of the second resin may be larger than a height of the first resin. In this case, since the height of the first resin located on the emission end side is smaller than the height of the second resin, even when the warping or the like occurs in the housing under a high temperature environment, the decrease in bonding efficiency can be more reliably suppressed.

In the embodiment, respective separate resins are used for the emission end side and the light emitting element side. However, the resin may be provided only on the light emitting element side. Under a high temperature environment, since the resin located on the light emitting element side expands thermally larger than the carrier located on the emission end side, a configuration in which the inclination angle becomes smaller can be effectively realized. In this case, even when the warping or the like occurs in the housing under a high temperature environment, the decrease in bonding efficiency can be surely suppressed.

The optical transmitter described above may include a plurality of light emitting elements and a plurality of light receiving elements provided corresponding to the respective plurality of light emitting elements. Optical path lengths of the plurality of output lights from the plurality of light emitting elements through the plurality of light receiving elements may be different from each other. An angle of the mounting surface that mounts the light receiving element that receives the output light with a small optical path length may be larger than the angle of the mounting surface that mounts the light receiving element that receives the output light with a large optical path length. By the way, the smaller the optical path length is, the less likely to decrease the light amount of the output light. The larger the inclination angle of the mounting surface of the light receiving element, the less likely to decrease the received light amount when the temperature rises. As mentioned above, when the inclination angle of the mounting surface of the light receiving element that receives the output light with a small optical path length is larger than the inclination angle of the mounting surface of the light receiving element that receives the output light with a large optical path length, the variation in the light amount of light in the plurality of output lights can be suppressed.

The carrier may be made of glass or a material containing an alloy of iron, chromium, and nickel.

The coefficient of thermal expansion of the first resin and the coefficient of thermal expansion of the second resin may be larger than a coefficient of thermal expansion of the carrier.

The housing may include a recess having a bottom portion at a position lower than a main surface of the housing. The bottom surface of the carrier of the second mounting portion may be mounted on the bottom portion of the recess.

An optical transmitter according to another aspect includes a housing with an emission end, a light emitting element mounted on a first mounting portion of the housing, and a light receiving element mounted on a second mounting portion of the housing to monitor output light from the light emitting element. The second mounting portion is provided with a carrier and a first resin located on a lower side of the carrier. A coefficient of thermal expansion of the first resin is larger than a coefficient of thermal expansion of the carrier.

In the optical transmitter, the light emitting element is mounted on the first mounting portion of the housing, and the light receiving element that monitors the output light from the light emitting element is mounted on the second mounting portion of the housing. The second mounting portion has a carrier that mounts the light receiving element and a first resin that is located on the lower side of the carrier and on the light emitting element side of the housing. The coefficient of thermal expansion of the first resin located on the light emitting element side is larger than the coefficient of thermal expansion of the carrier. Therefore, under a high temperature environment, since the first resin located on the light emitting element side expands thermally larger than the carrier, the received light amount of the light receiving element can be intentionally reduced. As a result, the received light amount of the light receiving element is reduced, so that the power of light from the light emitting element can be increased. Therefore, even when the warping or the like occurs in the housing at a high temperature, since the influence of the warping can be reduced by the first resin, the decrease in the light amount of the output light to the optical fiber at a high temperature can be suppressed.

Specific examples of the optical transmitter of the present disclosure will be described below with reference to the drawings. It is noted that the present invention is not limited to the following examples, but is indicated by the scope of the claims and is intended to include all modified examples within the scope of the claims and equivalents thereof. In the description of the drawings, the same or corresponding elements are denoted by the same reference numerals, and duplicate description will be omitted as appropriate. The drawings may be partially simplified or exaggerated for ease of understanding, and the dimensional ratios and the like are not limited to those described in the drawings.

FIG. 1 is a perspective view illustrating an optical transmitter 1 according to the present embodiment. As illustrated in FIG. 1, the optical transmitter 1 includes a housing 2, a cover 3 that covers the housing 2, a receptacle 4 having a cylindrical sleeve, and a wiring board 5. The optical transmitter 1 extends along a longitudinal direction D1, and the receptacle 4, the cover 3 (housing 2), and the wiring board 5 are arranged in this order.

Figure 2:
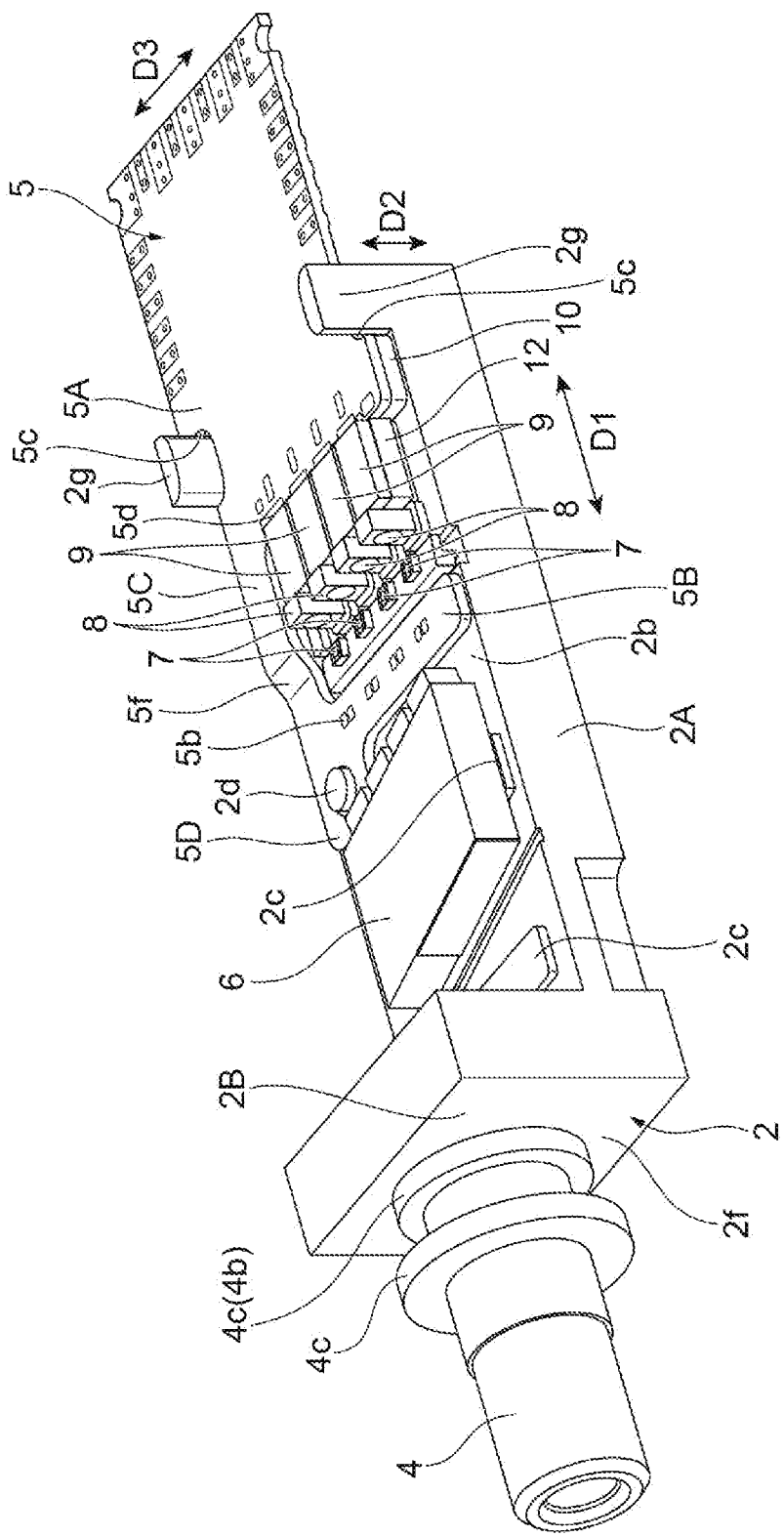
FIG. 2 is a perspective view illustrating a state in which a cover is removed from the optical transmitter of FIG. 1.

FIG. 2 is a perspective view of the optical transmitter 1 with the cover 3 removed. As illustrated in FIGS. 1 and 2, the housing 2 includes a lower board 2A extending in the longitudinal direction D1 and a side wall 2B extending from one end of the longitudinal direction D1 of the lower board 2A in a height direction D2. The housing 2 is made of, for example, a metal. The material of the housing 2 is, for example, Kovar (an alloy in which at least nickel and cobalt are mixed with iron) or SUS (Stainless Used Steel). The housing 2 may be made of iron, chromium, an alloy of iron and chromium, an alloy of iron and nickel, or plastic.

The shape of the housing 2 viewed from a width direction D3 of the optical transmitter 1 is L-shaped. The housing 2 is also referred to as an L-shaped base. The receptacle 4 is inserted into the side wall 2B, a hole which is an emission end of output light L (refer to FIG. 4) is formed, and the hole penetrates through the side wall 2B in the longitudinal direction D1. The receptacle 4 is formed in a cylindrical shape. The receptacle 4 has a plurality of flanges 4c. One of the plurality of flanges 4c functions as a guide 4b that determines a position of the receptacle 4. In the receptacle 4, for example, the guide 4b comes into contact with an outer surface 2f of the side wall 2B in a state of being fixed to the housing 2.

As viewed from the height direction D2, for example, the housing 2 has a rectangular shape. The housing 2 is a component that mounts a component accommodated inside the optical transmitter 1. Each component of the optical transmitter 1 is mounted on the lower board 2A. The lower board 2A is an elongated portion protruding from the side wall 2B in the longitudinal direction D1, and each component of the optical transmitter 1 is mounted on the elongated portion. The lower board 2A has a main surface 2b that faces each component inside the optical transmitter 1, a convex mounting surface 2c that mounts the component, a guide pin 2d that determines a position of the cover 3 with respect to housing 2, and the outer surface 2f that is exposed to the outside of the optical transmitter 1.

The main surface 2b has a rectangular shape extending in the longitudinal direction D1 and the width direction D3. The mounting surface 2c is a portion of the main surface 2b that protrudes in the height direction D2, and for example, a wave combiner 6 that performs wave combining of light is mounted on the mounting surface 2c. The guide pin 2d protrudes in the height direction D2 on the main surface 2b. The guide pin 2d is, for example, cylindrical. The guide pin 2d is provided, for example, on one side of the width direction D3 (a position deviated from the center of the width direction D3 of the housing 2). The cover 3 is a component that covers the housing 2 from the height direction D2, and each component of the optical transmitter 1 is accommodated inside the housing 2 and the cover 3. The cover 3 has a convex portion in which a hole in which the guide pin 2d of the housing 2 is fitted is formed. The cover 3 is fixed to the housing 2 by fitting the hole of the convex portion into the guide pin 2d.

The optical transmitter 1 includes the wiring board 5, the wave combiner 6, a light receiving element 7, a first lens 8, a light emitting element 9, and a spacer 10 inside the housing 2 and the cover 3. A portion of the wiring board 5 extends from the housing 2 and the cover 3 to the opposite side of receptacle 4. The portion of the wiring board 5 extending to the opposite side with the receptacle 4 protrudes to the outside of the optical transmitter 1.

Figure 3:
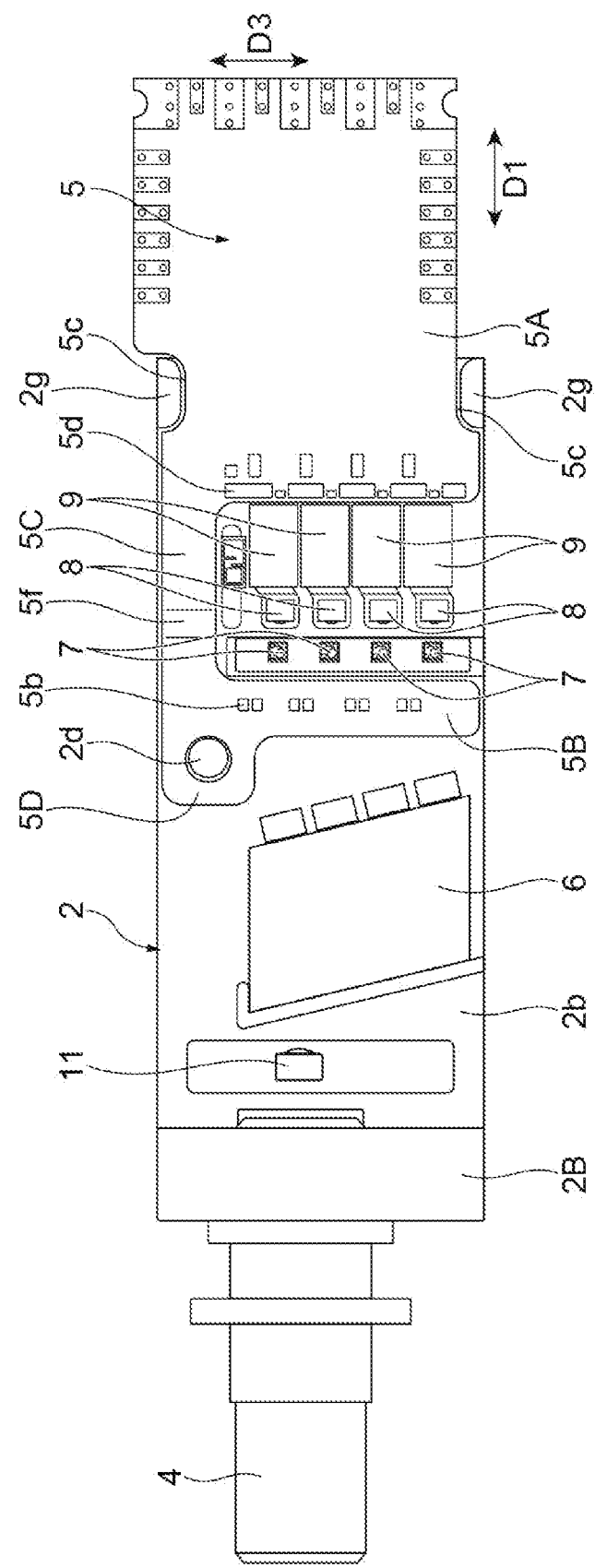
FIG. 3 is a plan view illustrating a state in which the cover is removed from the optical transmitter of FIG. 1.

FIG. 3 is a plan view illustrating each component mounted on the main surface 2b of the housing 2. As illustrated in FIGS. 2 and 3, the optical transmitter 1 further includes a second lens 11 intervening between the receptacle 4 and the wave combiner 6. For example, the optical transmitter 1 includes four light emitting elements 9, four first lenses 8, four light receiving elements 7, the wave combiner 6, and the second lens 11.

The optical transmitter 1 is a four-lane multi-channel light emitting module including four light emitting elements 9, four first lenses 8, and four light receiving elements 7. As described above, in the optical transmitter 1 provided with the optical paths of the output light L of four lanes, the optical path lengths of the output light L are different from each other for each channel. The receptacle 4 is disposed, for example, at a position deviated from the center of the width direction D3 of the housing 2. The optical path of the output light L from the light emitting element 9 located at the end portion of the opposite side with the receptacle 4 of the width direction D3 (the end portion of the lower side in FIG. 3) is the longest. The optical path of the output light L from the light emitting element 9 located at the end portion on the receptacle 4 side of the width direction D3 (the end portion of the upper side in FIG. 3) is the shortest.

A plurality of the light emitting elements 9 and a plurality of the light receiving elements 7 are mounted on the housing 2. The plurality of light emitting elements 9 are disposed so as to be aligned along the width direction D3, and the plurality of light receiving elements 7 are disposed so as to be aligned along the width direction D3. For example, each of the four light emitting elements 9 is mounted on the main surface 2b of the housing 2 via a carrier 12 (first mounting portion). Each light emitting element 9 is provided corresponding to each of the four first lenses 8 and each of the four light receiving elements 7. Each light emitting element 9 is, for example, a semiconductor laser diode (LD). The output light L, which is a divergent light output from the light emitting element 9, is converted into collimated light by each first lens 8. For example, each of the four light receiving elements 7 is mounted on the main surface 2b of the housing 2 via a carrier 13 (second mounting portion 20). The main surface 2b of the carrier 13 is provided with a recess (concave portion). This recess is for adjusting the height. There may be a state where no recess is on the main surface 2b. It is noted that the above-described height can be adjusted by the carrier 13.

The wiring board 5 is, for example, an FPC (Flexible Printed Circuit) mounted on the housing 2. The housing 2 is provided with a pair of protruding portions 2g protruding upward at the end portion of the opposite side with the side wall 2B of the longitudinal direction D1. The pair of protruding portions 2g are disposed so as to be aligned along the width direction D3. The wiring board 5 includes a first region 5A extending to the outside of the optical transmitter 1, a second region 5B provided with a pad 5b, and a connection region 5C connecting the first region 5A and the second region 5B to each other. As viewed from the height direction D2, the first region 5A, the second region 5B, and the connection region 5C have a U-shape (C-shape).

The first region 5A has a concave portion 5c at both ends of the width direction D3. The first region 5A has a pair of concave portions 5c aligned in the width direction D3. The wiring board 5 is fixed to the housing 2 by fitting each protruding portion 2g of the housing 2 into each concave portion 5c. The first region 5A includes a pad 5d that is electrically connected to the light emitting element 9. For example, each of the plurality of light emitting elements 9 is electrically connected to the pad 5d via a wire. The first region 5A is provided at a position higher than the second region 5B (a position separated from the main surface 2b of the housing 2). For example, the height of the first region 5A coincides with the height of the carrier 12 that mounts the light emitting element 9. Accordingly, it is possible to shorten the length of the wire extending from each light emitting element 9 to the pad 5d.

For example, one wiring board 5 has the first region 5A as an upper stage and the second region 5B as a lower stage and is fixed to the housing 2 by adhesion. The second region 5B is provided at a position lower than the first region 5A and is in contact with, for example, the main surface 2b of the housing 2. Due to the low position of the second region 5B, the wire extending from the wiring board 5 or the light receiving element 7 can be prevented from interfering with the output light L passing through the light emitting element 9 and the first lens 8.

The width of the connection region 5C of the wiring board 5 (the length of the width direction D3) is smaller than the width of the first region 5A and the width of the second region 5B, respectively. The connection region 5C is provided, for example, in the end portion on the receptacle 4 side of the width direction D3. The connection region 5C extends from the end portion of the width direction D3 of the first region 5A to the end portion of the width direction D3 of the second region 5B. The thickness of the wiring board 5 in the first region 5A and the thickness of the wiring board 5 in the second region 5B are, for example, the same as each other. The connection region 5C extends in the longitudinal direction D1 between the first region 5A and the second region 5B and is located, for example, in the end portion of the width direction D3 of the housing 2.

The connection region 5C has a step difference or an inclination located between the first region 5A and the second region 5B. In this embodiment, an example in which the connection region 5C has an inclination 5f is illustrated. The wiring board 5 may include an extension region 5D in which a hole into which the guide pin 2d of the housing 2 is inserted is formed on the extension of the connection region 5C.

The spacer 10 is provided between the first region 5A and the housing 2, and for example, the height of the first region 5A is secured by the spacer 10. Instead of the spacer 10, a reinforcing plate made of an insulating material may be provided to the first region 5A of the wiring board 5. In this case, it is possible to provide a wiring pattern on the lower surface of the first region 5A as well.

Figure 4:
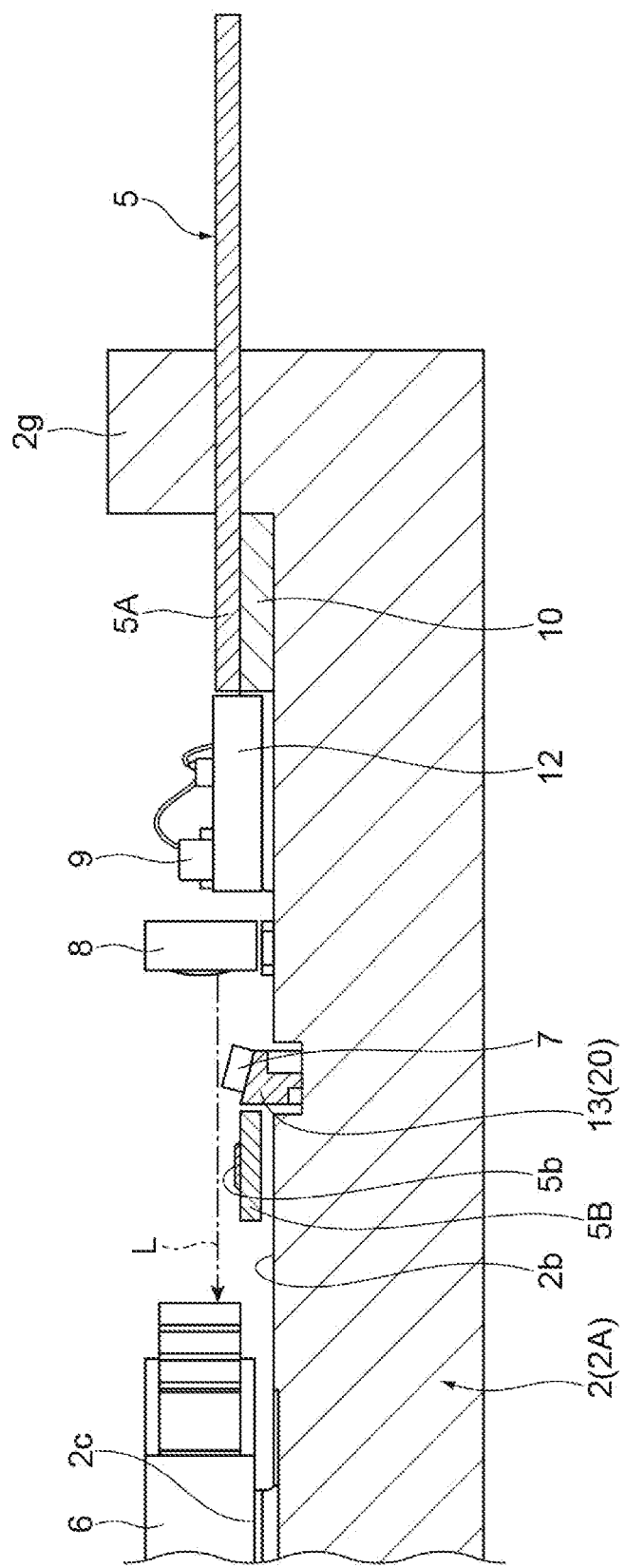
FIG. 4 is a cross-sectional view illustrating a housing, a wave combiner, a wiring board, a light receiving element, and a light emitting element of the optical transmitter of FIG. 1.

FIG. 4 is a side sectional view of the housing 2 illustrating the light emitting element 9, the first lens 8, the light receiving element 7, the wiring board 5, and the wave combiner 6. As illustrated in FIGS. 3 and 4, the output light L output from the light emitting element 9 via the first lens 8 is input to the wave combiner 6 through the light receiving element 7. The wave combiner 6 is, for example, an optical wave combiner that wave-combines four output lights L.

The four output lights L are wave-combined inside the wave combiner 6 and output from the wave combiner 6 to the second lens 11 as one output light L. The second lens 11 condenses the output light L from the wave combiner 6 and condenses the output light L on the optical fiber retained in the receptacle 4. The output light L is output to the outside of the optical transmitter 1 via the optical fiber retained in the receptacle 4.

The light receiving element 7 is a monitor PD (Photo Diode) that monitors the output light L from each of the plurality of light emitting elements 9. The light receiving element 7 monitors the intensity of the output light L by receiving a portion of the output light L from the light emitting element 9. For example, each of the four light receiving elements 7 is mounted on the main surface 2b of the housing 2 via the carrier 13 (second mounting portion 20) made of glass or a material containing SUS (alloy of iron, chromium, and nickel). As an example, the coefficient of thermal expansion of glass is $7.1 \times 10^{-6}$/K, and the coefficient of thermal expansion of SUS is $11 \times 10^{-6}$/K. It is noted that the recess is provided on the main surface 2b of the housing 2 on which the carrier 13 (second mounting portion 20) is mounted. Accordingly, the height of the light receiving element 7 from the main surface 2b can be adjusted.

The light receiving element 7 converts a portion of the output light L from the light emitting element 9 into an electric signal and outputs the converted electric signal to the pad 5b of the wiring board 5 via a wire (not illustrated). The light receiving element 7 and the wire extending from the light receiving element 7 to the pad 5b are provided on the light output side (receptacle 4 side) of the light emitting element 9. By the output of the electric signal from the light receiving element 7, APC control (Auto Power Control) can be executed for the output light L from the light emitting element 9.

Figure 5:
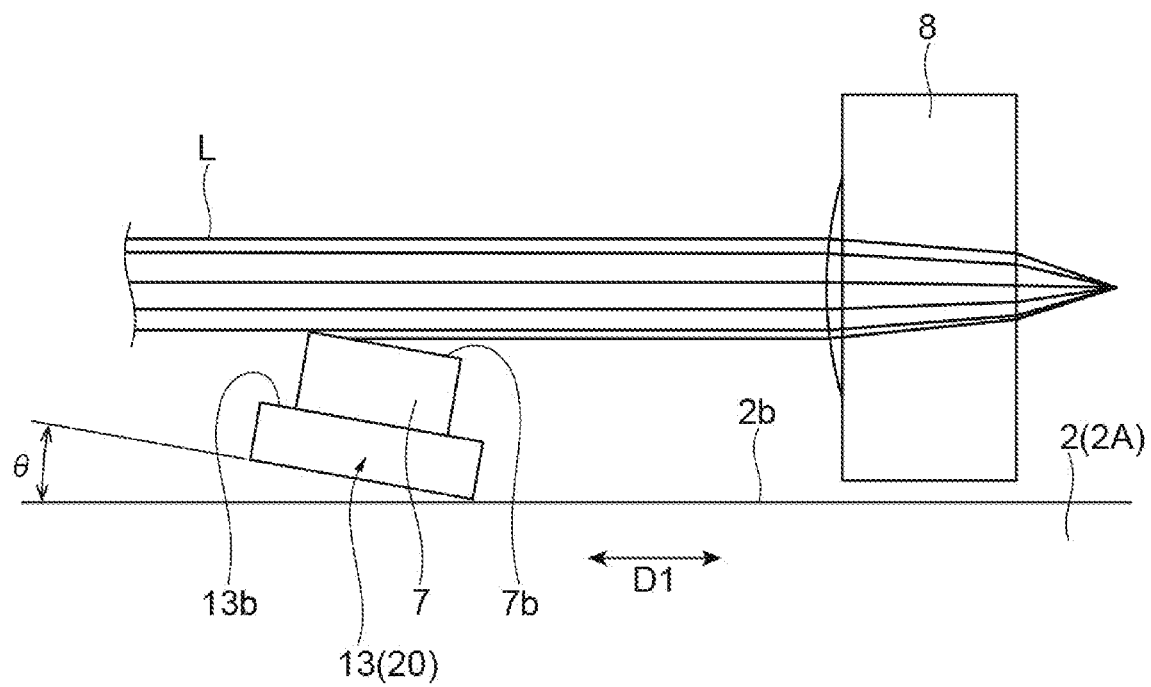
FIG. 5 is a side view schematically illustrating a positional relationship between emitted light from the light emitting element of FIG. 4 and the light receiving element.

FIG. 5 is a side view schematically illustrating the light receiving element 7 and the first lens 8. As illustrated in FIGS. 4 and 5, the second region 5B is a PD wiring FPC having the pad 5b for being wired to the light receiving element 7 and is located on the light output side (receptacle 4 side) of the light receiving element 7. The carrier 13 has a mounting surface 13b that mounts the light receiving element 7. The mounting surface 13b is disposed so as to be inclined so as to form an inclination angle $\theta$ with respect to the optical axis of the output light L from the light emitting element 9 (the optical axis extending from the light emitting element 9 along the longitudinal direction D1).

The light receiving element 7 is a surface-incident type light receiving element and has a light receiving surface 7b on the surface. Since the mounting surface 13b is disposed so as to be inclined with respect to the optical axis of the output light L, the light receiving surface 7b of the light receiving element 7 is also disposed so as to be inclined with respect to the optical axis of the output light L. By disposing the light receiving element 7 so that the light receiving surface 7b is inclined with respect to the optical axis of the output light L, the light receiving element 7 receives a portion of the output light L.

Therefore, by disposing the light receiving element 7 on the light output side of the light emitting element 9, it is possible to monitor the output light L on the light output side with a simple configuration. Wiring such as a wire for the light receiving element 7 which is a monitor PD is provided on the light output side of the light receiving element 7. Therefore, it is possible to electrically connect the light receiving element 7 to the light receiving element 7 without lowering the light receiving sensitivity. Since the light receiving element 7 is directly wired to the pad 5b on the wiring board 5, for example, it is not necessary to separately mount the carrier or the like. Therefore, this configuration contributes to cost reduction.

Figure 6:
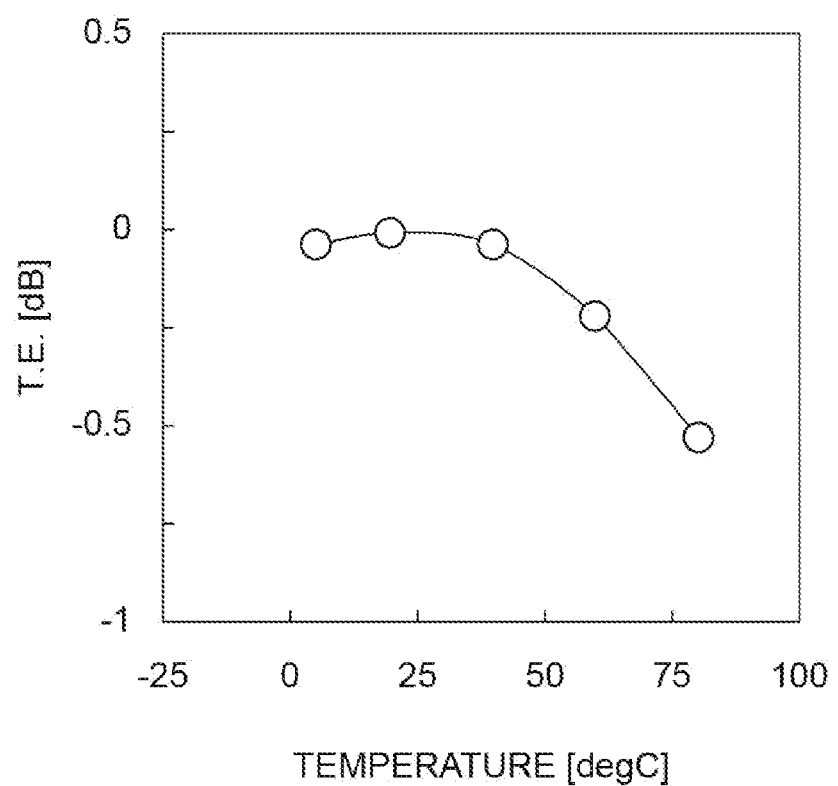
FIG. 6 is a graph illustrating a relationship between temperature of the housing of FIG. 4 and a tracking error.

FIG. 6 is a graph illustrating a relationship between the temperature of the housing 2 and the tracking error. The horizontal axis of the graph of FIG. 6 represents the temperature of the housing 2, and the vertical axis of the graph of FIG. 6 represents the output of the optical fiber when the current of the light receiving element 7 is constant. As illustrated in FIG. 6, when the temperature of the housing 2 becomes high, the output of output light L via the optical fiber is decreased. The housing 2 may cause the warping or the like under a high temperature environment. Under a high temperature environment, since the warping of the housing 2 may cause the output light L to deviate from the center of the optical fiber, the light amount of the output light L may be allowed to be reduced, and the tracking error may be allowed to be increased.

In the optical transmitter 1 according to the present embodiment, the carrier 13 is inclined so that the inclination angle θ becomes small under a high temperature environment, so that the received light amount of the light receiving element 7 is intentionally reduced at a high temperature. When the received light amount of the light receiving element 7 is decreased, since the current to the light emitting element 9 is increased in order to increase the light amount to the light receiving element 7, the light emitting power of the output light L from the light emitting element 9 is increased. As a result, the increase in tracking error is suppressed.

Figure 7:
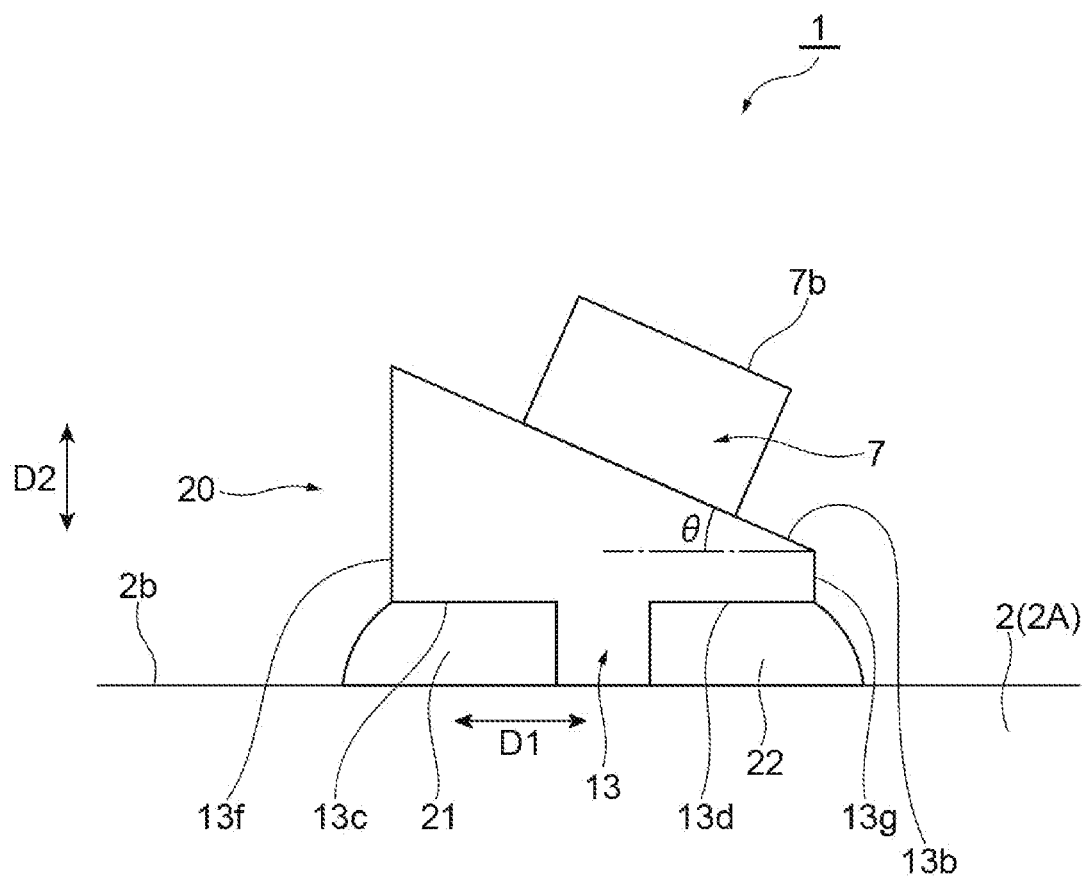
FIG. 7 is a side view illustrating a carrier, a first resin, and a second resin of a second mounting portion that mounts the light receiving element of FIG. 4.

As illustrated in FIG. 7, in the optical transmitter 1, the second mounting portion 20 for mounting the light receiving element 7 is provided with the carrier 13, a first resin 21 located on the lower side (main surface 2b side) and the emission end side (receptacle 4 side) of the carrier 13, and a second resin 22 located on the lower side and the light emitting element 9 side of the carrier 13. The carrier 13 has the mounting surface 13b, a first concave portion 13c into which the first resin 21 enters, and a second concave portion 13d into which the second resin 22 enters, as described above.

The mounting surface 13b is inclined so as to protrude upward in direction to the emission end side, and thus, the light receiving element 7 can receive a portion of the output light L on the light receiving surface 7b. The first concave portion 13c is a portion recessed from a side surface 13f of the emission end side of the carrier 13. For example, the first concave portion 13c is filled with the first resin 21 so as to slightly protrude from the first concave portion 13c. The second concave portion 13d is a portion recessed from a side surface 13g of the carrier 13 on the light emitting element 9 side. For example, the second concave portion 13d is filled with the second resin 22 so as to slightly protrude from the second concave portion 13d.

The thickness of the first resin 21 (the length of the height direction D2) and the thickness of the second resin 22 are, for example, 50 μm. The coefficient of thermal expansion of the first resin 21 is smaller than the coefficient of thermal expansion of the second resin 22. As a result, since the first resin 21 expands smaller than the second resin 22 at a high temperature, the inclination angle θ can be reduced at a high temperature. As an example, the coefficient of thermal expansion of the second resin 22 is $237\times10^{-6}$/K, and the coefficient of thermal expansion of the first resin 21 is $54\times10^{-6}$/K.

The function and effect obtained from the optical transmitter 1 according to the present embodiment will be described. In the optical transmitter 1, the light emitting element 9 is mounted on the carrier 12 (first mounting portion), and the light receiving element 7 that monitors the output light L from the light emitting element 9 is mounted on the second mounting portion 20 of the housing 2. The second mounting portion 20 has the carrier 13 that mounts the light receiving element 7, the first resin 21 that is located on the lower side of the carrier 13 and on the emission end side of the housing 2, and the second resin 22 that is located on the lower side of the carrier 13 and on the light emitting element 9 side of the housing 2. The coefficient of thermal expansion of the first resin 21 located on the emission end side is smaller than the coefficient of thermal expansion of the second resin 22 located on the light emitting element 9. Therefore, under a high temperature environment, since the first resin 21 located on the emission end side expands thermally smaller than the second resin 22 located on the light emitting element 9, the received light amount of the light receiving element 7 can be reduced. Therefore, when the warping or the like occurs in the housing 2 at a high temperature, the received light amount of the light receiving element 7 can be reduced, so that the power of output light L from light emitting element 9 can be increased. As a result, it is possible to reduce the influence or the like of the warping of the housing 2 at a high temperature and suppress the decrease in the light amount of the output light L to the optical fiber at a high temperature.

The mounting surface 13b of the light receiving element 7 of the second mounting portion 20 is disposed so as to be inclined with respect to the optical axis of the output light L from the light emitting element 9. Therefore, under a high temperature environment, since the first resin 21 located on the emission end side expands thermally smaller than the second resin 22 located on the light emitting element 9, the inclination angle θ can be more effectively reduced.

The housing 2 may be manufactured by MIM (Metal Injection Molding). In this case, the cost for manufacturing the housing 2 can be suppressed. In the housing 2, since the side wall 2B to which the receptacle 4 is mounted and the lower board 2A on which the component is mounted are integrated, the component tolerance can be likely to be reduced, and the housing 2 can be allowed to be highly rigid. The housing 2 is provided with the pair of protruding portions 2g protruding upward at the end portion of the opposite side with the side wall 2B of the longitudinal direction D1. Therefore, for example, even when the housing 2 with the mounted component is accidentally disposed upside down, since the side wall 2B and the protruding portion 2g hit the floor or the like, the mounted component can be prevented from interfering with the floor or the like.

The carrier 13 may be made of glass or a material containing SUS (alloy of iron, chromium, and nickel). The coefficient of thermal expansion of the first resin 21 and the coefficient of thermal expansion of the second resin 22 may be larger than a coefficient of thermal expansion of the carrier 13. The housing 2 has a recess having a bottom portion at a position lower than the main surface 2b of the housing 2, and the bottom surface of carrier 13 of the second mounting portion 20 may be mounted on the bottom portion of the recess.

In the optical transmitter 1, the coefficient of thermal expansion of the first resin 21 located on the emission end side is smaller than the coefficient of thermal expansion of the carrier 13. Therefore, under a high temperature environment, since the first resin 21 located on the emission end side expands thermally smaller than the carrier 13, the received light amount of the light receiving element can be intentionally reduced. As a result, even when the warping or the like occurs in the housing under a high temperature environment and the light output to the outside of the housing 2 is likely to be decreased, the received light amount of the light receiving element 7 is decreased, so that the power of light from the light emitting element 9 can be increased. Therefore, even when the warping or the like occurs in the housing 2 at a high temperature, since the influence of the warping can be reduced by the first resin 21, the decrease in the light amount of the output light to the optical fiber can be suppressed at a high temperature.

Figure 8:
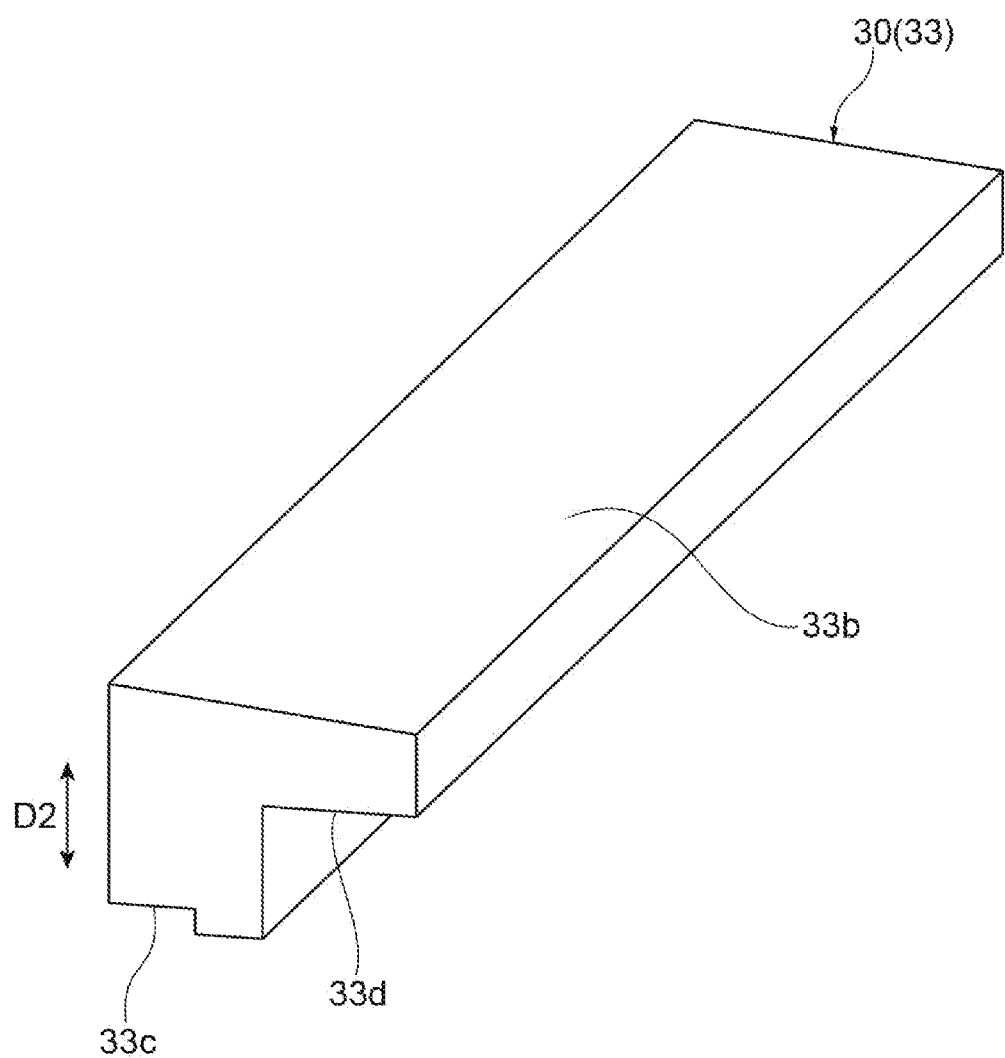
FIG. 8 is a perspective view illustrating a carrier according to Modified Example 1.
Figure 9:
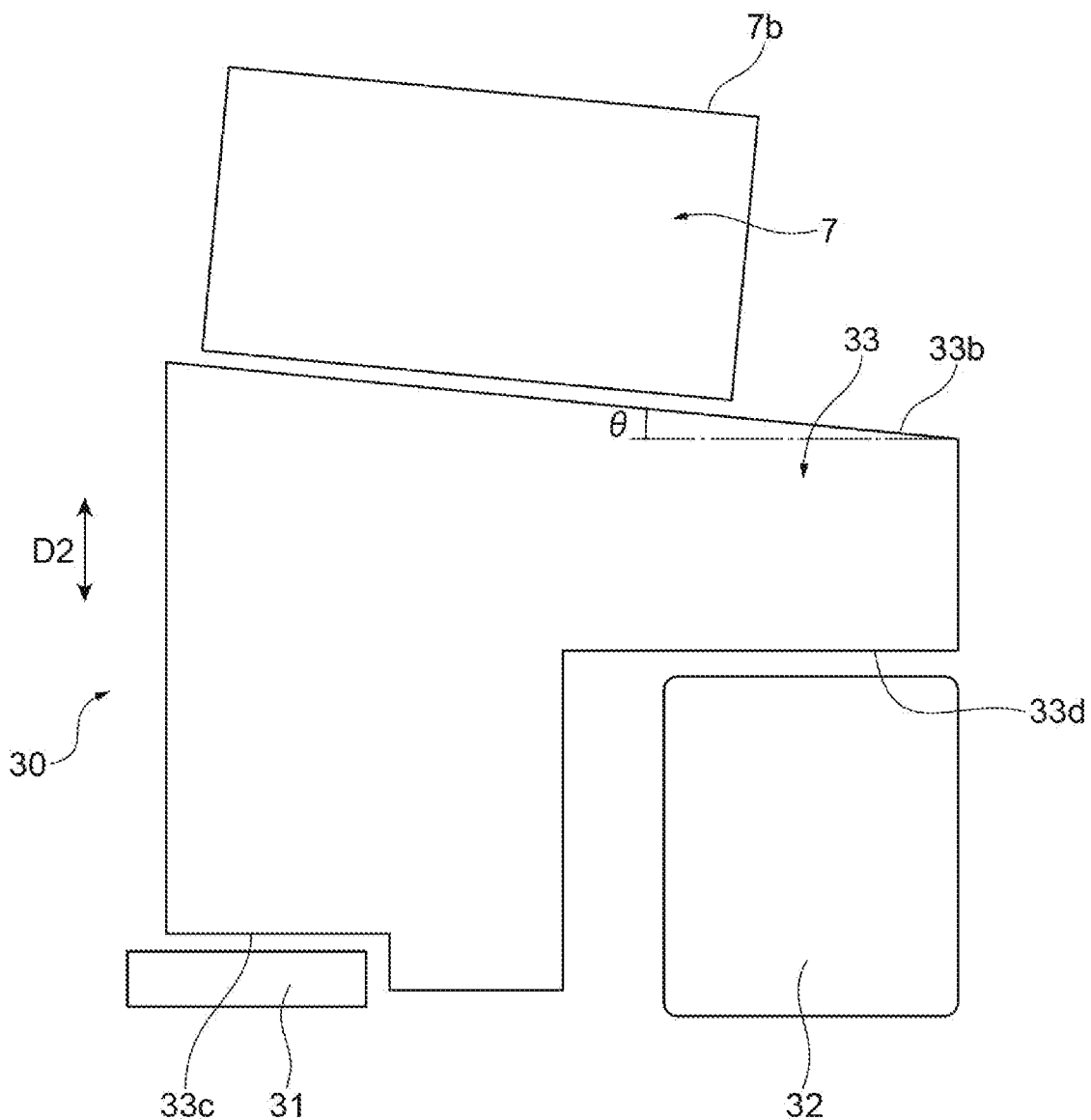
FIG. 9 is a side view illustrating the carrier, a first resin, and a second resin of FIG. 8.

A second mounting portion 30 of the optical transmitter according to the modified example will be described with reference to FIGS. 8 and 9. In the following, in order to avoid duplication, the description of duplication with optical transmitter 1 described above will be omitted as appropriate. FIG. 8 is a perspective view illustrating a carrier 33 of the second mounting portion 30. FIG. 9 is a side view schematically illustrating the second mounting portion 30. As illustrated in FIGS. 8 and 9, the second mounting portion 30 is provided with the carrier 33 that mounts the light receiving element 7, a first resin 31 that is located on the lower side and the emission end side of the carrier 33, and a second resin 32 that is located on the light emitting element 9 on the lower side of the carrier 33. The thickness of the first resin 31 and the second resin 32 is different from that of the first resin 21 and the second resin 22 described above.

The carrier 33 has a mounting surface 33b on which the light receiving element 7 is mounted, a first concave portion 33c into which the first resin 31 enters, and a second concave portion 33d into which the second resin 32 enters. The mounting surface 33b is inclined so as to protrude upward in direction to the emission end side. The height of the first concave portion 33c (the length of the height direction D2) is smaller than the height of the second concave portion 33d. As an example, the thickness of the second concave portion 33d is 300 μm, and the thickness of the first concave portion 33c is 50 μm.

The thickness of the first resin 31 is smaller than the thickness of the second resin 32. For example, a coefficient of thermal expansion of the first resin 31 is smaller than a coefficient of thermal expansion of the second resin 32. As a result, since the second resin 32 expands more than the first resin 31 at a high temperature, the inclination angle θ can be more effectively reduced at a high temperature. As an example, the coefficient of thermal expansion of the second resin 32 is $237 \times 10^{-6}$/K, and the coefficient of thermal expansion of the first resin 31 is $54 \times 10^{-6}$/K.

In the optical transmitter according to the modified example, the height of the second resin 32 is larger than the height of the first resin 31. Therefore, the height of the first resin 31 located on the emission end side is smaller than the height of the second resin 32, so that the inclination angle θ can be more effectively reduced. Therefore, even when the warping or the like occurs in the housing 2 under a high temperature environment, the decrease in the light amount of the output light L can be more reliably suppressed.

Figure 10:
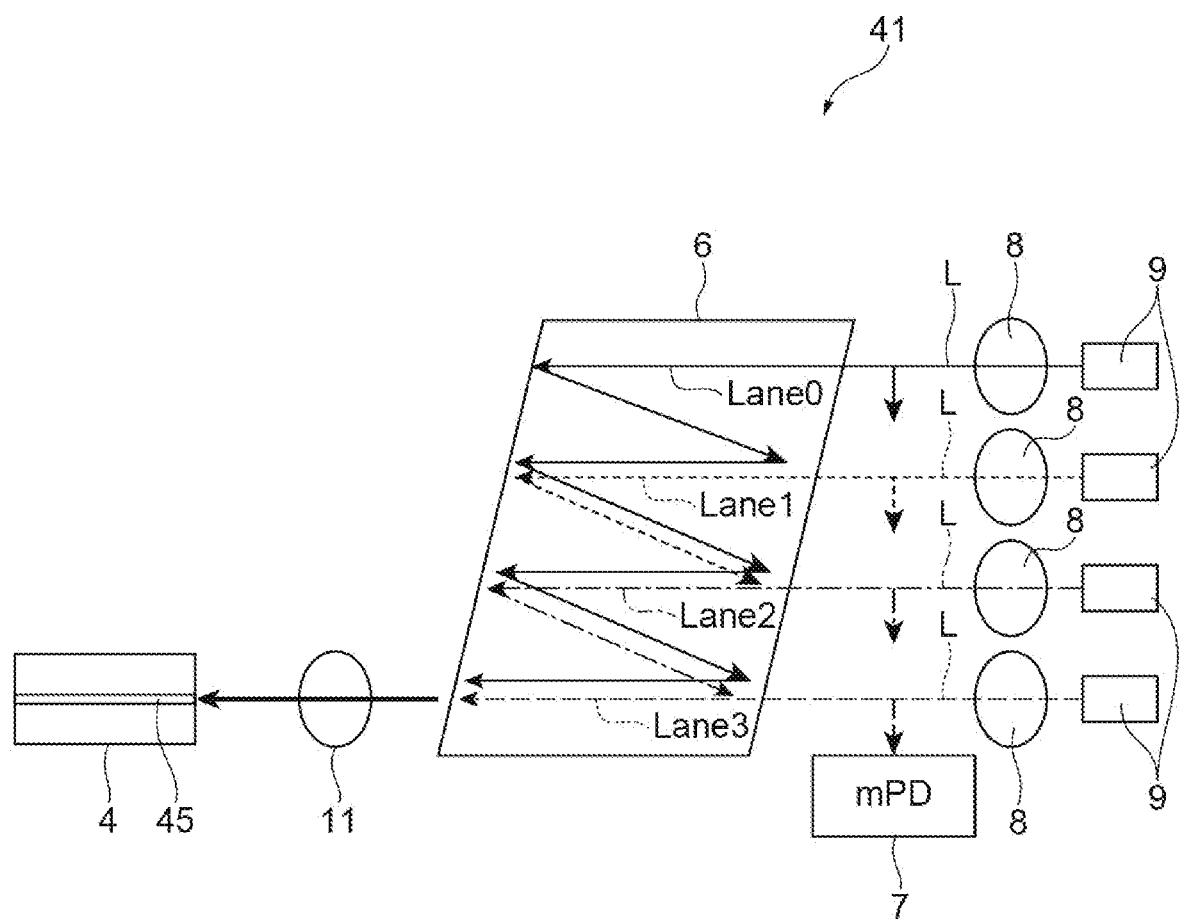
FIG. 10 is a plan view schematically illustrating an optical path of output light passing through the light emitting element, the light receiving element, the wave combiner, and the optical fiber of FIG. 4

An optical transmitter 41 according to another modified example will be described with reference to FIG. 10. FIG. 10 is a plan view schematically illustrating an optical fiber 45 retained in the light emitting element 9, the first lens 8, the light receiving element 7, the wave combiner 6, the second lens 11, and the receptacle 4 of the optical transmitter 41. As illustrated in FIG. 10, similarly to the optical transmitter 1 described above, the optical transmitter 41 includes an optical path of an output light L of four lanes.

In the optical transmitter 41, the optical path lengths of the output light L are different for each channel. For example, when the farthest lane from the optical fiber 45 is Lane 0, the next farthest lane is Lane 1, the third farthest lane is Lane 2, and the nearest lane is Lane 3, the output light L of Lane 0 is most susceptible to the tracking errors.

Figure 11:
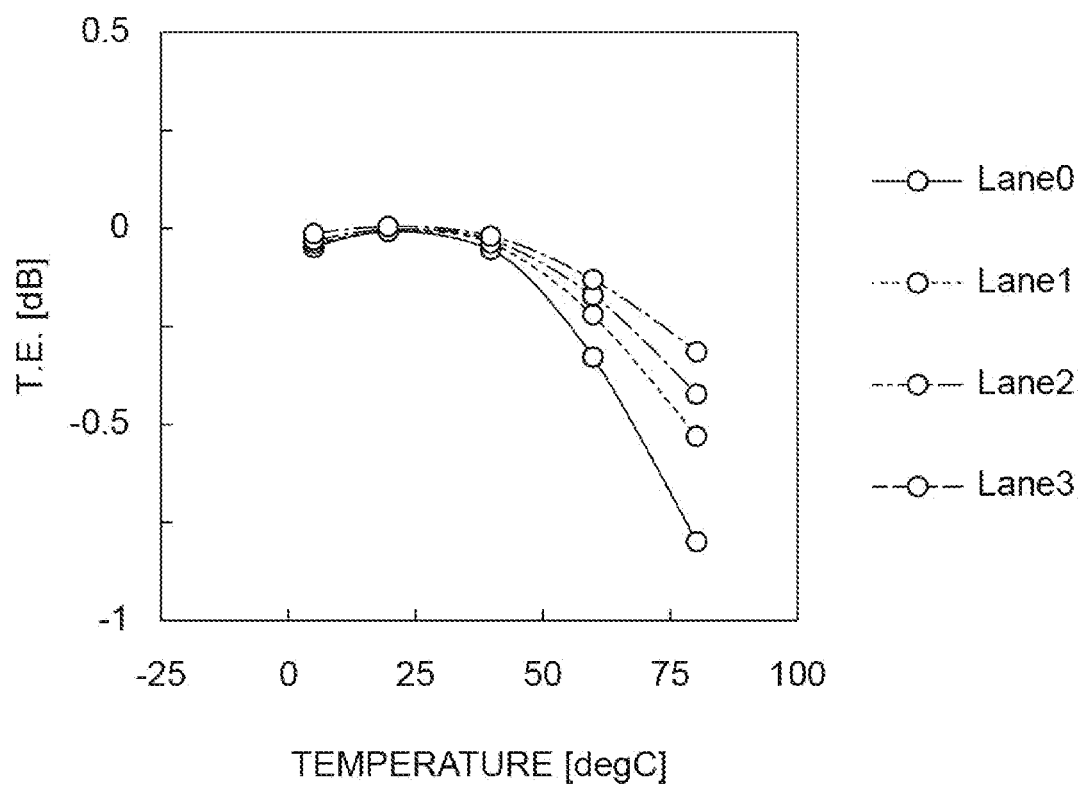
FIG. 11 is a graph illustrating the relationship between the temperature of the housing of FIG. 4 and the tracking error for each output light lane.

FIG. 11 is a graph illustrating the relationship between the temperature of the housing 2 and the tracking error. The horizontal axis of the graph of FIG. 11 represents the temperature of the housing 2, and the vertical axis of the graph of FIG. 11 represents the output of the optical fiber 45 when the current of the light receiving element 7 is constant. As illustrated in FIG. 11, when the temperature of the housing 2 becomes high, the output of Lane 0 becomes the smallest, and the decrease in the output of Lane 3 is less than that of other lanes. That is, it can be seen that the larger the optical path length is, the larger the tracking error becomes, and the more easily the decrease in the output light L to the optical fiber 45 occurs.

Figure 12:
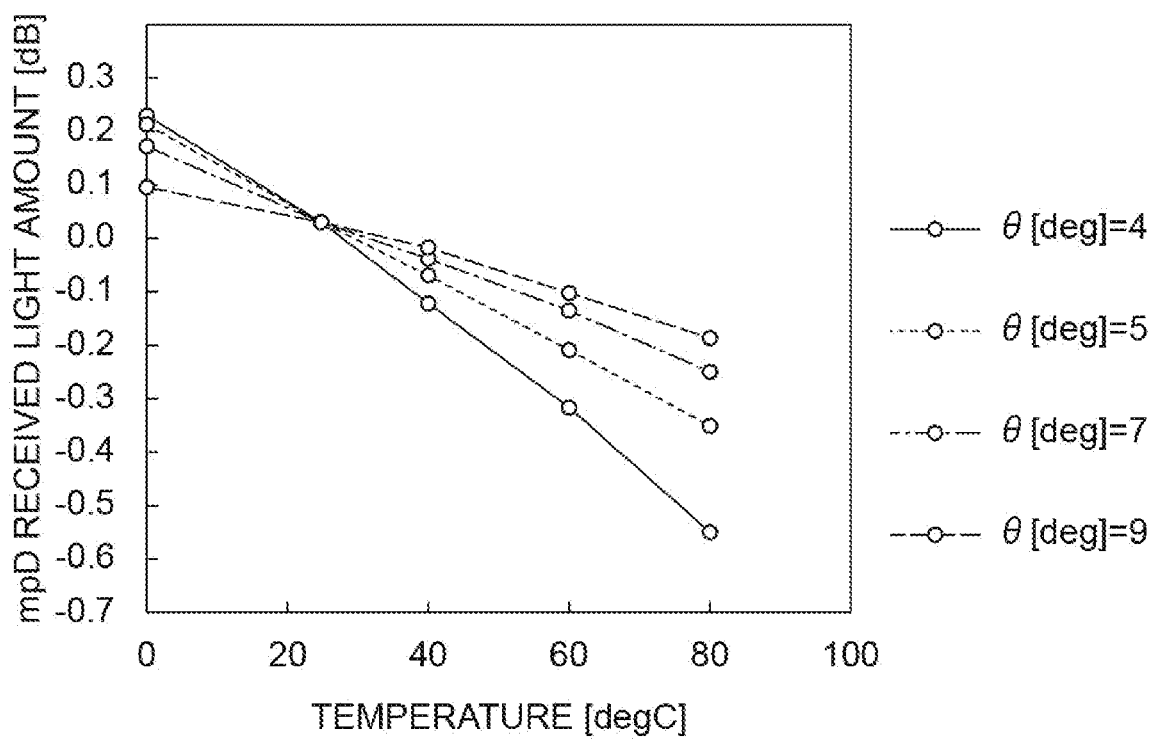
FIG. 12 is a graph illustrating a relationship between the temperature of the housing of FIG. 4 and the received light amount of the light receiving element for each inclination angle of the light receiving surface.

FIG. 12 is a graph illustrating a relationship between the temperature of the housing 2 and the received light amount of the light receiving element 7 for each inclination angle θ. The horizontal axis of the graph of FIG. 12 represents the temperature of the housing 2, and the vertical axis of the graph of FIG. 12 represents the received light amount of the light receiving element 7. As illustrated in FIG. 12, it can be seen that the smaller the inclination angle θ, the more easily the received light amount changes depending on the temperature. It can be seen that the smaller the inclination angle θ, the smaller the received light amount of the light receiving element 7 at a high temperature.

Figure 13:
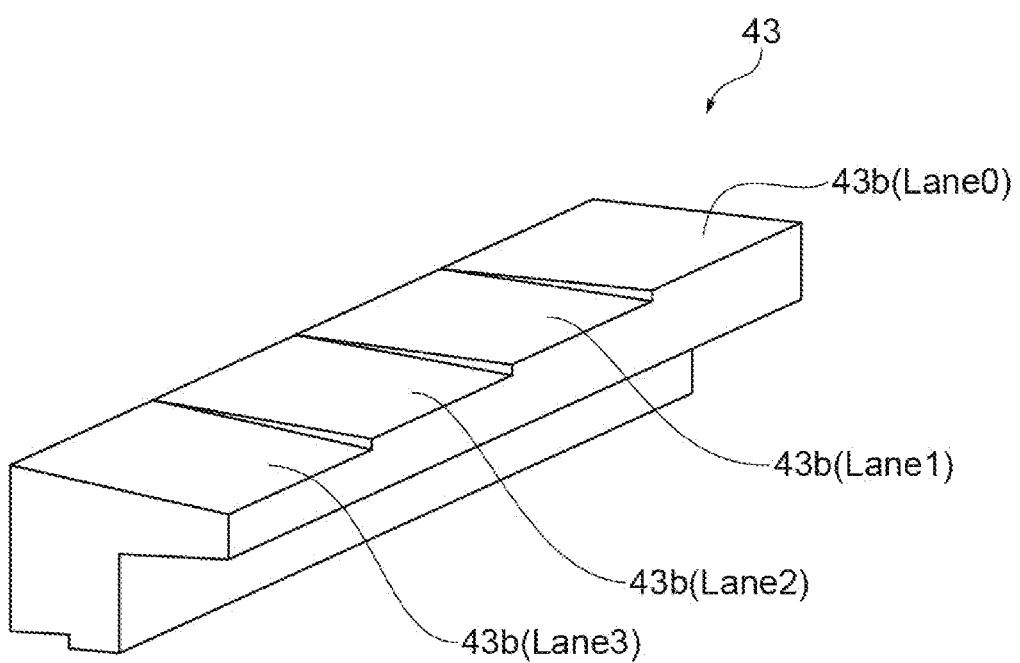
FIG. 13 is a perspective view illustrating a carrier of a second mounting portion according to a further modified example.

FIG. 13 is a perspective view illustrating a carrier 43 constituting the second mounting portion of the optical transmitter 41. As illustrated in FIG. 13, in the carrier 43, the inclination angle θ of a mounting surface 43b differs depending on the lane. The inclination angle θ is the smallest in Lane 0, which has the largest optical path length, and the inclination angle θ is the largest in Lane 3, which has the smallest optical path length. That is, since the inclination angle θ is the smallest in Lane 0 where the tracking error tends to be large, the received light amount of the light receiving element 7 can be more effectively reduced at a high temperature. As an example, the inclination angle θ in Lane 0 is 4°, the inclination angle θ of the mounting surface 43b in Lane 1 is 5°, the inclination angle θ of the mounting surface 43b in Lane 2 is 7°, and the inclination angle θ of the mounting surface 43b in Lane 3 is 9°.

As described above, similarly to the optical transmitter 1 described above, the optical transmitter 41 includes a plurality of the light emitting elements 9 and a plurality of the light receiving elements 7 provided corresponding to each of the plurality of light emitting elements 9. The optical path lengths of the plurality of output lights L passing through the plurality of light receiving elements 7 from the plurality of light emitting elements 9 are different from each other. The angle of the mounting surface 43b (for example, Lane 3) that mounts the light receiving element 7 that receives the output light L with a small optical path length is larger than the angle of the mounting surface 43b (for example, Lane 0) that mounts the light receiving element 7 that receives the output light L with a large optical path length. As described above, the smaller the optical path length of the output light L, the less likely to decrease the light amount of the output light L. The larger the inclination angle θ of the mounting surface 43b of the light receiving element 7, the less likely to decrease the received light amount when the temperature rises.

Figure 14:
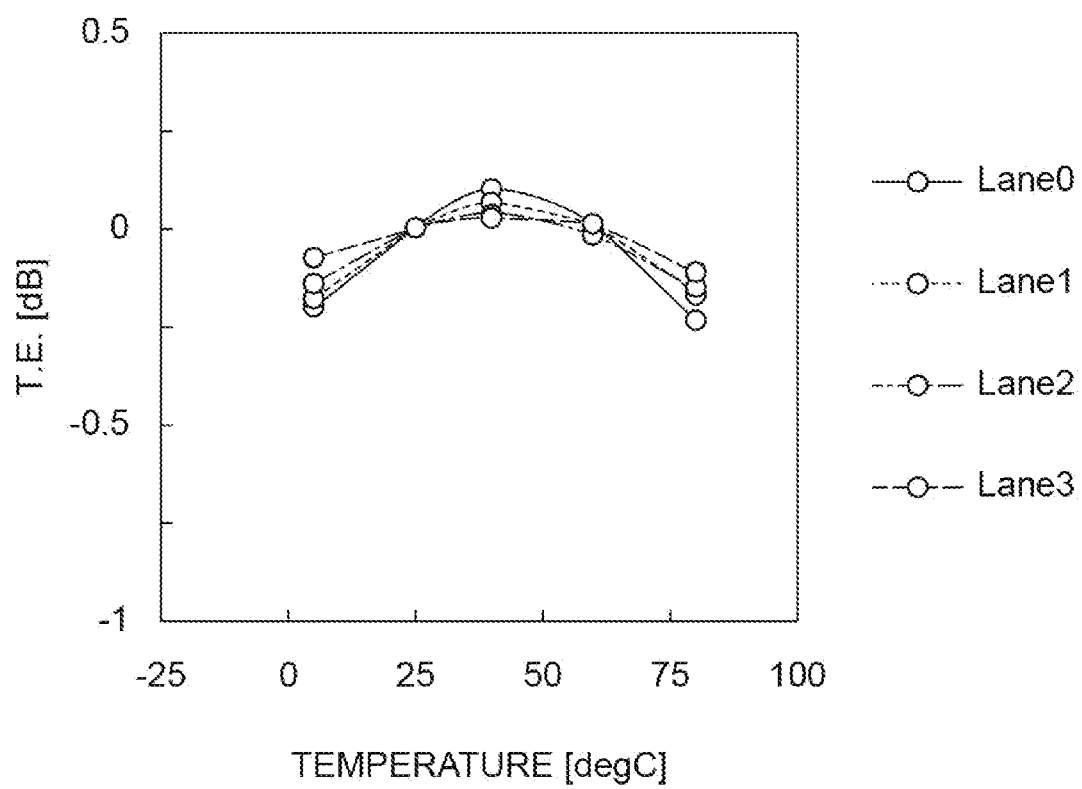
FIG. 14 is a graph illustrating a relationship between the received light amount of the light receiving element mounted on the carrier of FIG. 13 and the tracking error for each output light lane.

Therefore, when the inclination angle θ of the mounting surface 43b of the light receiving element 7 that receives the output light L having a small optical path length is larger than the inclination angle θ of the mounting surface 43b of the light receiving element 7 that receives the output light L having a large optical path length, as illustrated in FIG. 14, the variation in the light amount in the plurality of output lights L can be suppressed. It is noted that FIG. 14 is a graph illustrating a relationship between the temperature of the housing 2 and the tracking error when the carrier 43 of the optical transmitter 41 is used. As described above, it can be seen that the carrier 43 can reduce the tracking error in each of the plurality of lanes.

The embodiment of the optical transmitter according to the present disclosure has been described above. However, the present invention is not limited to the above-described embodiment. That is, it is easily recognized by those skilled in the art that the present invention can be modified and changed in various ways without changing the spirit described in the claims. For example, the shape, size, number, material, and disposition mode of each component of the optical transmitter are not limited to those described above, and may be appropriately changed. For example, in the above description, the optical transmitter 1 and the optical transmitter 41 have been described as the optical transmitter according to the embodiment. However, an optical transmitter in which some configurations of these optical transmitter 1 and optical transmitter 41 are combined may be used.

REFERENCE SIGNS LIST

1: optical transmitter, 2: housing, 2A: lower board, 2B: side wall, 2b: main surface, 2c: mounting surface, 2d: guide pin, 2f: outer surface, 2g: protruding portion, 3: cover, 4: receptacle, 4b: guide, 4c: flange, 5: wiring board, 5A: first region, 5b: pad, 5B: second region, 5C: connection region, 5c: concave portion, 5d: pad, 5f: inclination, 6: wave combiner, 7: light receiving element, 7b: light receiving surface, 8: first lens, 9: light emitting element, 10: spacer, 11: second lens, 12: carrier (first mounting portion), 13: carrier (second mounting portion), 13b: mounting surface, 13c: first concave portion, 13d: second concave portion, 13f, 13g: side surface, 20, 30: second mounting portion, 21, 31: first resin, 22, 32: second resin, 33: carrier, 33b: mounting surface, 33c: first concave portion, 33d: second concave portion, 41: optical transmitter, 43: carrier, 43b: mounting surface, 45: optical fiber, D1: longitudinal direction, D2: height direction, D3: width direction, L: output light, θ: inclination angle.

The invention claimed is:

1. An optical transmitter comprising:
a housing with an emission end;
a light emitting element mounted on a first mounting portion of the housing; and
a light receiving element mounted on a second mounting portion of the housing to monitor output light from the light emitting element,
wherein the second mounting portion is provided with a carrier, a first resin located on an emission end side of a lower side of the carrier, and a second resin located on a light emitting element side of the lower side of the carrier, and
wherein a coefficient of thermal expansion of the first resin is smaller than a coefficient of thermal expansion of the second resin.

2. The optical transmitter according to claim 1, wherein a mounting surface of the light receiving element of the second mounting portion is disposed so as to be inclined with respect to the optical axis of the output light from the light emitting element.

3. The optical transmitter according to claim 2, comprising:
a plurality of the light emitting elements; and
a plurality of the light receiving elements provided corresponding to the respective plurality of the light emitting elements,
wherein optical path lengths of a plurality of the output lights from the plurality of light emitting element to the plurality of light receiving element are different from each other, and
wherein an angle of the mounting surface that mounts the light receiving element that receives the output light having a small optical path length is larger than an angle of the mounting surface that mounts the light receiving element that receives the output light having a large optical path length.

4. The optical transmitter according to claim 1, wherein a height of the second resin is larger than a height of the first resin.

5. The optical transmitter according to claim 1, wherein the carrier is made of glass or a material containing an alloy of iron, chromium, and nickel.

6. The optical transmitter according to claim 1, wherein the coefficient of thermal expansion of the first resin and the coefficient of thermal expansion of the second resin are larger than a coefficient of thermal expansion of the carrier.

7. The optical transmitter according to claim 1,
wherein the housing includes a recess having a bottom portion at a position lower than a main surface of the housing, and
wherein the bottom surface of the carrier of the second mounting portion is mounted on the bottom portion of the recess.

* * * * *